(12) United States Patent
Kim

(10) Patent No.: US 12,255,193 B2
(45) Date of Patent: Mar. 18, 2025

(54) METHOD FOR TRANSFERRING MICRO LED

(71) Applicant: INDUSTRY-UNIVERSITY COOPERATION FOUNDATION HANYANG UNIVERSITY ERICA CAMPUS, Ansan-si (KR)

(72) Inventor: Jaekyun Kim, Seoul (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 381 days.

(21) Appl. No.: 17/616,631

(22) PCT Filed: Jun. 5, 2020

(86) PCT No.: PCT/KR2020/007359
§ 371 (c)(1),
(2) Date: Dec. 3, 2021

(87) PCT Pub. No.: WO2020/246855
PCT Pub. Date: Dec. 10, 2020

(65) Prior Publication Data
US 2022/0231002 A1   Jul. 21, 2022

(30) Foreign Application Priority Data

Jun. 5, 2019   (KR) .......... 10-2019-0066331
Feb. 17, 2020  (KR) .......... 10-2020-0018804

(51) Int. Cl.
*H01L 21/00*   (2006.01)
*H01L 23/00*   (2006.01)
*H01L 25/16*   (2023.01)

(52) U.S. Cl.
CPC ............ *H01L 25/167* (2013.01); *H01L 24/24* (2013.01); *H01L 24/82* (2013.01); *H01L 24/95* (2013.01);
(Continued)

(58) Field of Classification Search
CPC ....... H01L 25/167; H01L 24/24; H01L 24/82; H01L 24/95; H01L 2224/24105;
(Continued)

(56) References Cited

U.S. PATENT DOCUMENTS 8,110,979 B2   2/2012  Park et al.
10,128,307 B2  11/2018 Chang
(Continued)

FOREIGN PATENT DOCUMENTS

KR  10-2010-0107316 A   10/2010
KR     10-1058880 B1     8/2011
(Continued)

OTHER PUBLICATIONS

International Search Report issued on Sep. 17, 2020, for corresponding International Patent Application No. PCT/KR2020/007359, along with an English translation.
(Continued)

*Primary Examiner* — Ismail A Muse
(74) *Attorney, Agent, or Firm* — Hauptman Ham, LLP

(57) ABSTRACT

The present invention discloses a method for transferring a micro LED that is capable of easily mounting a micro LED or a nano LED on a desired position on a substrate by using an electric field.

7 Claims, 11 Drawing Sheets

(52) U.S. Cl.
CPC ............... *H01L 2224/24105* (2013.01); *H01L 2224/24147* (2013.01); *H01L 2224/82002* (2013.01); *H01L 2224/82101* (2013.01); *H01L 2224/95101* (2013.01); *H01L 2224/95133* (2013.01)

(58) Field of Classification Search
CPC . H01L 2224/24147; H01L 2224/82002; H01L 2224/82101; H01L 2224/95101; H01L 2224/95133; H01L 25/075; H01L 27/12; H01L 27/15; H01L 27/156; G09F 9/33; G09G 3/32
See application file for complete search history.

(56) References Cited

U.S. PATENT DOCUMENTS

| | | | |
|---|---|---|---|
| 10,340,419 | B2 | 7/2019 | Kim et al. |
| 10,410,998 | B2 | 9/2019 | Kim et al. |
| 2010/0244663 | A1 | 9/2010 | Park et al. |
| 2012/0326181 | A1 | 12/2012 | Shibata et al. |
| 2018/0019377 | A1 | 1/2018 | Kim et al. |
| 2018/0182740 | A1 | 6/2018 | Kim et al. |
| 2018/0233536 | A1 | 8/2018 | Chang |
| 2019/0172819 | A1* | 6/2019 | Bae ..................... H01L 25/167 |
| 2019/0326474 | A1 | 10/2019 | Kim et al. |
| 2019/0378985 | A1* | 12/2019 | Lin ...................... H10K 71/50 |
| 2020/0152835 | A1* | 5/2020 | Ko ........................ H01L 33/38 |
| 2022/0069004 | A1* | 3/2022 | Kang ................... H01L 27/156 |
| 2022/0223575 | A1* | 7/2022 | Kim ..................... H01L 25/167 |
| 2024/0088117 | A1* | 3/2024 | Kim ..................... H01L 33/483 |

FOREIGN PATENT DOCUMENTS

| | | |
|---|---|---|
| KR | 10-2014-0048647 A | 4/2014 |
| KR | 10-2018-0009014 A | 1/2018 |
| KR | 10-2018-0009015 A | 1/2018 |
| KR | 10-2018-0071465 A | 6/2018 |
| KR | 10-2018-0077114 A | 7/2018 |
| KR | 10-2018-0092731 A | 8/2018 |

OTHER PUBLICATIONS

Written Opinion issued on Sep. 17, 2020, for corresponding International Patent Application No. PCT/KR2020/007359.

* cited by examiner

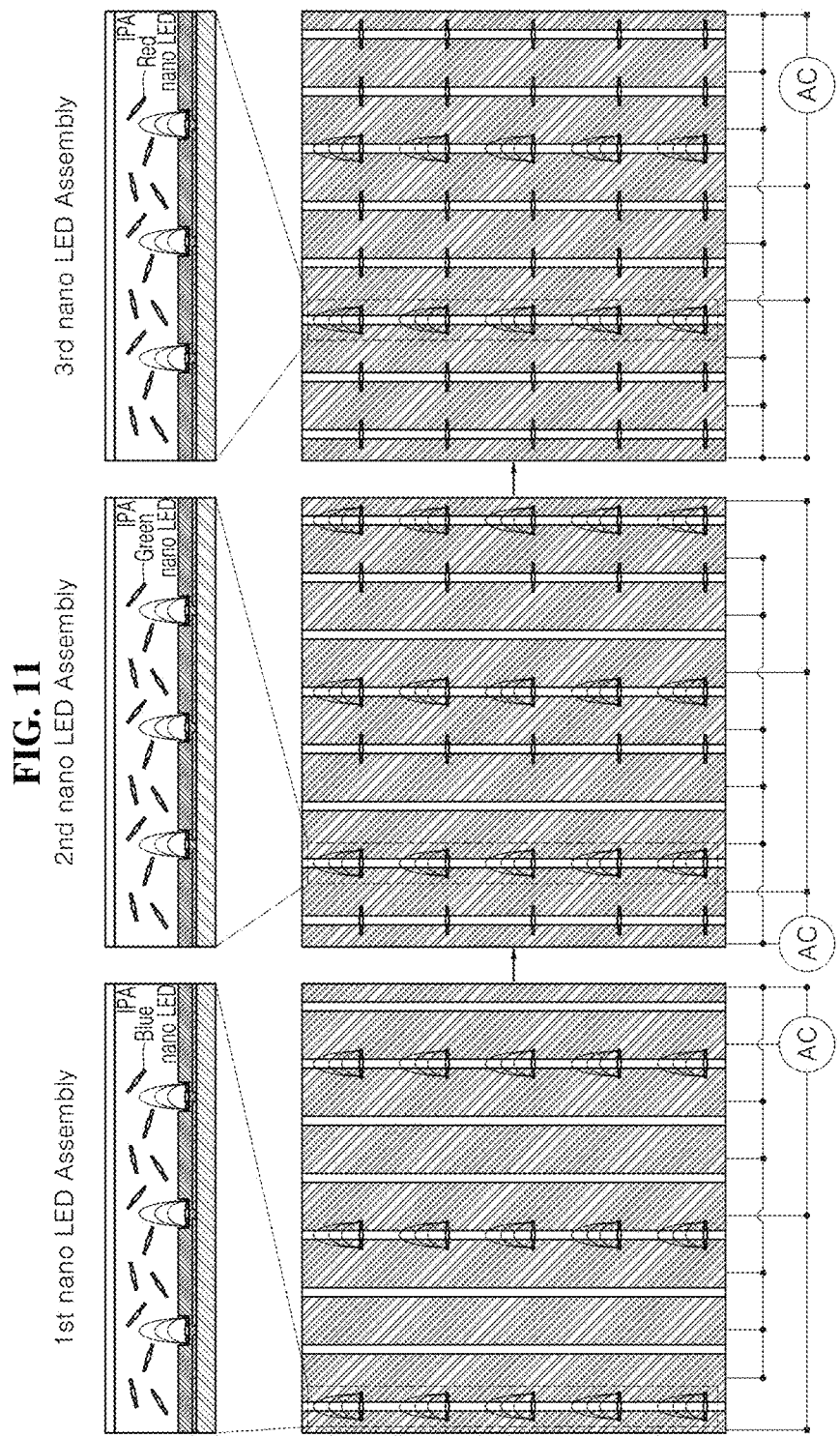

METHOD FOR TRANSFERRING MICRO LED

CROSS-REFERENCE TO RELATED APPLICATIONS

The application is a national phase of PCT/KR2020/007359 filed on Jun. 5, 2020, which is based on and claims priority to Korean Patent Application No. 10-2019-0066331 filed on Jun. 5, 2019 and Korean Patent Application No. 10-2020-0018804 filed on Feb. 17, 2020, which are incorporated herein by reference in their entireties.

TECHNICAL FIELD

The present disclosure relates to a method for transferring a micro LED. More particularly, the present disclosure relates to a method for transferring a micro LED including forming a micro LED receiving area having a trench structure (a micro-well structure), and easily mounting the micro LED or nano LED in the micro LED receiving area on a substrate using an electric field.

DESCRIPTION OF RELATED ART

Recently, a micro LED is emerging as an ideal display element.

The micro LED display has self-luminous ability. Compared to OLEDs with the same self-luminescence ability, the micro LED is superior in terms of a reaction speed, brightness, and color reproducibility and has low power driving characteristics. The micro LED display has high durability and longevity due to characteristics of an inorganic element, and is more advantageously applied to mobile displays.

Due to the characteristics of the micro LED, the micro LED may be assembled in a module manner, and thus may be applied to a large display with high resolution.

Further, a micro LED display may be implemented as a flexible display.

The micro LED display is manufactured by directly implanting and transferring the micro LED to a RGB pixel position.

In terms of commercialization of the micro LED, productivity, a process cost, a transfer success percentage, a large-area process, high integration, and coupling compatibility of the micro LED with a backplane as well as possibility of mass transfer thereof should be verified. However, a conventional transfer process method, has a fundamental limitation in terms of commercialization.

The micro LEDs having a size of 3 to 100 μm should be implanted, in large quantities, at a desired position in a physical contact manner. However, as a size of the micro LED becomes smaller, it is very difficult to implant the micro LED in the physical contact manner.

In particular, the conventional transfer process may not achieve micro LED integration higher than 2000 ppi (pixel per inch).

In an alternative approach, a μLEDoS (micro LED on Si) scheme in which the micro LED is directly coupled to a Si-CMOS backplane chip without an individual transfer process is being considered. In such a transfer-free scheme, a blue micro LED and the Si CMOS are combined to each other, and a quantum dot-based color conversion layer is used for full-color display. However, due to the introduction of the color conversion layer, this scheme not only does not take advantage of the micro LED, but also requires development of an additional quantum dot color conversion layer.

Therefore, it is very urgent to develop a novel assembly scheme that may achieve a high-integration of the micro LEDs while overcoming the disadvantages of the conventional transfer scheme.

DISCLOSURE

Technical Purposes

A purpose of the present disclosure is to provide a method for transferring a micro LED in which the micro LED or nano LED may be easily mounted at a desired position on a substrate.

Purposes of the present disclosure are not limited to the above mentioned purposes. Other purposes and advantages of the present disclosure that are not mentioned above may be understood based on following descriptions, and will be more clearly understood based on the examples of the present disclosure. Further, it will be readily appreciated that the purposes and advantages of the present disclosure may be realized based on means and combinations thereof indicated in the scope of the claims.

Technical Solutions

In one embodiment, a method for transferring a micro LED is provided, the method comprising: an electrode layer forming step of forming a first electrode layer and a second electrode layer on a substrate such that the first and second electrode layers are horizontally spaced from each other, an insulating layer forming step of forming an insulating layer so as to cover an entirety of the first electrode layer, the second electrode layer and a gap area between the first electrode layer and the second electrode layer and such that a micro LED receiving area having a trench structure is formed in a partial area of the gap area, an LED positioning step of applying an electrical signal to the first electrode layer and the second electrode layer while supplying fluid containing therein the micro LED on the substrate, such that the micro LED is positioned into the micro LED receiving area having the trench structure, and an LED electrically-connecting step of partially removing the insulating layer and electrically-connecting both opposing horizontal ends of the micro LED to the first electrode layer and the second electrode layer, respectively.

The electrode layer forming step may include forming a first metal layer on the substrate, and removing a portion of the first metal layer corresponding to the gap area to form the first electrode layer and the second electrode layer spaced from each other.

The insulating layer forming step may include forming the insulating layer on the first electrode layer, the second electrode layer, and the gap area, and partially etching a portion of the insulating layer corresponding to the partial area of the gap area to form the micro LED receiving area.

A long side length of the micro LED receiving area having the trench structure may be larger than a width of the gap area.

The electrical signal may be a pulsed DC signal.

The LED electrically-connecting step may include applying photoresist on the insulating layer and the micro LED, removing portions of the photoresist corresponding to both opposing horizontal ends of the micro LED to form a photoresist pattern, removing portions of the insulating layer respectively disposed below the both opposing horizontal ends of the micro LED using the photoresist pattern as an etching mask, depositing or electroplating a metal into the portions in which the insulating layer has been removed such that the both opposing horizontal ends of the micro LED are electrically connected to the first electrode layer and the second electrode layer via the metal, respectively, and removing an entirety of the photoresist and the insulating layer.

The first electrode layer and the second electrode layer may be formed to protrude toward each other in the micro LED receiving area having the trench structure.

The fluid may include at least one of isopropyl alcohol, acetone, toluene or water.

The method may further comprise an electrode forming step of etching each of the first electrode layer and the second electrode layer into a predefined pattern to form a first electrode, a second electrode, and a power electrode.

Technical Effects

In the method for transferring the micro LED according to the present disclosure, the micro LED receiving area having the trench structure (micro-well structure) may be formed and then the micro LED or nano LED may be easily mounted at a desired position on the substrate using an electric field.

Accordingly, the method may improve the integration of the micro LEDs when applied to a LED display and at the same time improve a transfer yield.

Further, the method for transferring the micro LED according to the present disclosure may respectively electrically couple both opposing horizontal ends of the micro LED to the first electrode layer and the second electrode layer which have been horizontally spaced apart from the micro LED receiving area having the trench structure via the fixing electrodes, thereby securing a large contact area therebetween.

In addition to the above-described effects, the specific effects of the present disclosure will be described together while describing specific details for carrying out the disclosure below.

BRIEF DESCRIPTION OF THE DRAWINGS

FIG. 11 is a flowchart showing a method for positioning nano LEDs corresponding to RGB colors.

REFERENCE NUMERALS

Figure 1:
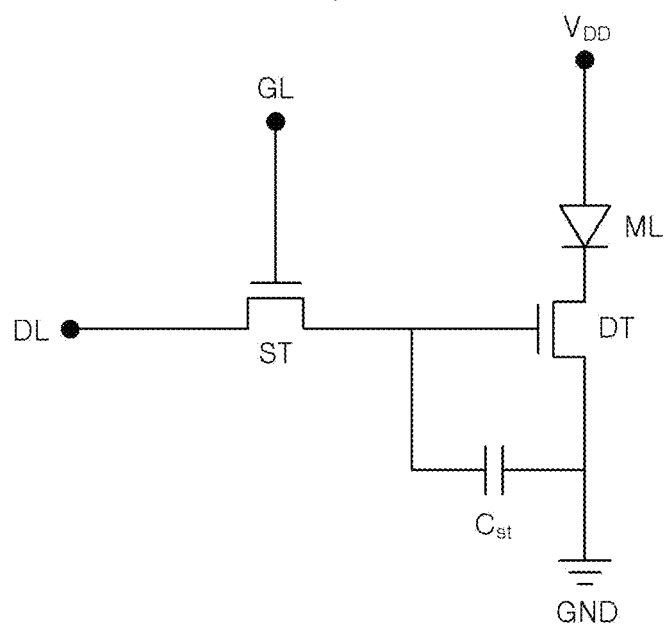
FIG. 1 shows a circuit diagram of a pixel of a general 2T-1C structure.

100; LED display ML; micro LED
131; first electrode layer 133; second electrode layer
140; insulating layer 151; first fixing electrode
153; second fixing electrode 161; first electrode
163; second electrode 165; power electrode
171, 173; metal layer

DETAILED DESCRIPTIONS

Specific structural or functional descriptions for embodiments according to the concept of the present disclosure that are set forth herein are merely illustrated for the purpose of describing embodiments according to the concept of the present disclosure. Embodiments according to the concept of the present disclosure may be implemented in various forms and are not limited to the embodiments as described herein.

Because the embodiments according to the concept of the present disclosure may have various changes and may have various forms, the embodiments will be illustrated in the drawings and described in detail herein. However, this is not intended to limit the embodiments according to the concept of the present disclosure to specific initiation forms. All changes, equivalents, or substitutes thereto may be included in the spirit and technical scope of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The terminology used herein is for the purpose of describing particular embodiments only and is not intended to limit the present disclosure. As used herein, the singular may constitute "a" and "an" are intended to include the plural may constitute as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method for transferring a micro LED according to some embodiments of the present disclosure will be described.

Figure 2:
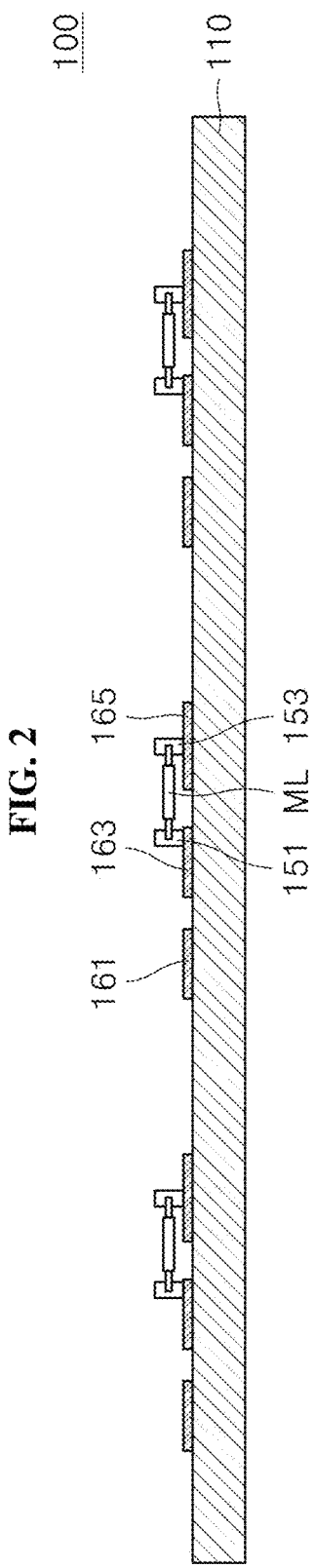
FIG. 2 shows a cross-sectional view of a LED display according to the present disclosure as cut in a A-B direction.

FIG. 1 shows a circuit diagram of a pixel of a general 2T-1C structure. FIG. 2 shows a cross-sectional view when a LED display as cut in a A-B direction.

FIG. 1 only shows a circuit diagram of a pixel having the simplest structure that may be manufactured according to the present disclosure. Thus, an embodiment of the present disclosure is not limited thereto. Referring to FIG. 1 to FIG. 2, one pixel of a LED display 100 may include a micro LED ML formed on a substrate 110. In this connection, the substrate may act as an active matrix backplane.

According to an embodiment, the micro LED ML may be embodied in a form of a nanowire having a length of 1 to 100 μm. The nanowire may have a cross-sectional diameter of about 10 nm to 10 μm. Further, the nanowire has a relatively high aspect ratio, and the aspect ratio may be in a range of approximately 1.1 to 10. The nanowire with a high aspect ratio may have a large surface area, and thus have excellent energy transfer and performance, and high transparency.

In the micro LED display 100, the micro LED may be transferred via an electrode layer forming step, an insulating layer forming step, a LED positioning step, a LED electrically-connecting step, and an electrode forming step, as described through FIG. 3A to FIG. 12D.

Figure 3A:
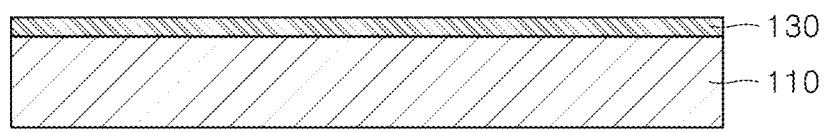
FIGS. 3A to 3C are cross-sectional views for illustrating an electrode layer forming step of forming a first electrode layer and a second electrode layer according to an embodiment of the present disclosure.
Figure 3B:
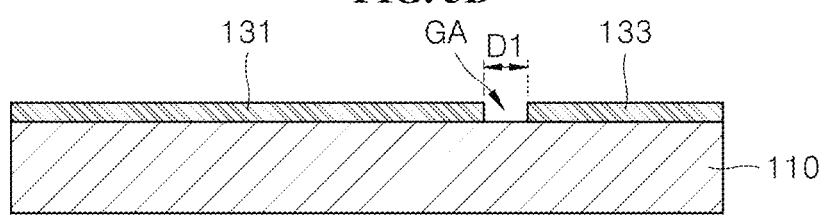
Figure 3C:
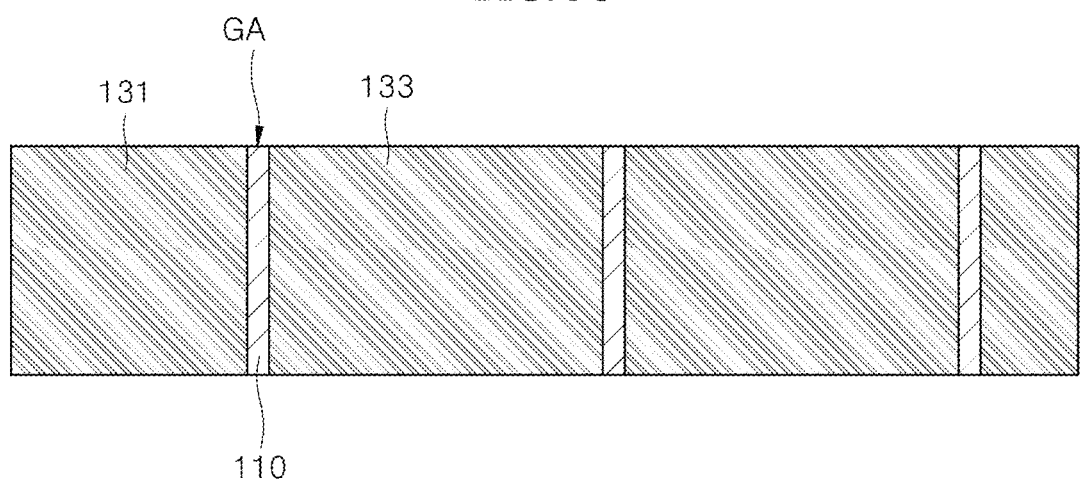

FIGS. 3A to 3C are cross-sectional views for illustrating an electrode layer forming step of forming a first electrode layer and a second electrode layer according to an embodiment of the present disclosure.

Referring to FIGS. 3A to 3C, a first electrode layer 131 and a second electrode layer 133 are formed during the electrode layer formation step.

As shown in FIG. 3A, a first metal layer 130 is deposited on the substrate.

Thereafter, as shown in FIG. 3B, the first electrode layer 131 and the second electrode layer 133 are formed by removing a portion of the first metal layer 130 corresponding to a gap area GA from the first metal layer 130.

According to an embodiment, a photoresist pattern is formed on the first metal layer 130 and in an area excluding the gap area GA. Then, a portion corresponding to the gap area GA of the first metal layer 130 may be removed by etching using the formed photoresist pattern as an etching mask.

Figure 5:
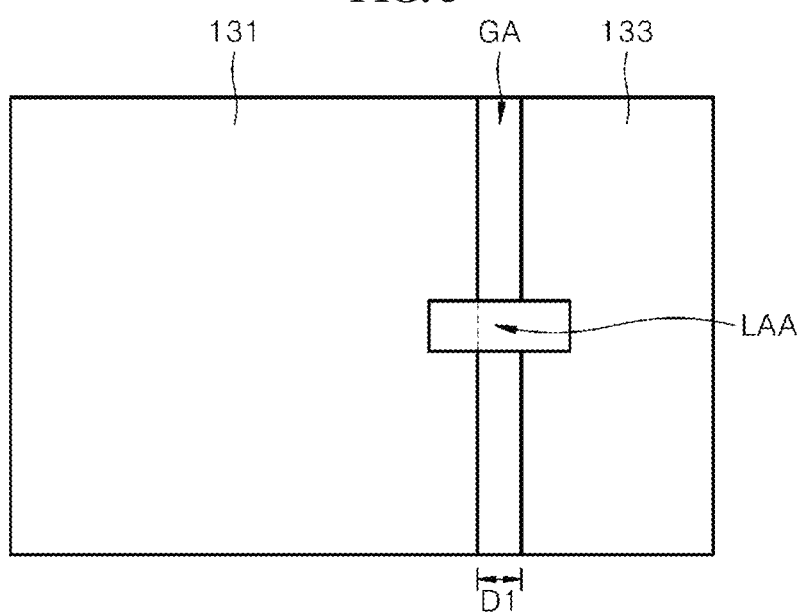
FIG. 5 is a plan view for illustrating an insulating layer forming step of forming an insulating layer containing a micro LED receiving area according to an embodiment of the present disclosure.

As shown in FIG. 3B and FIG. 5, the gap area GA may have a shape of a trench having a smaller width D1 and a larger length.

In general, a lot of metal wires are required because the micro LEDs should be connected to electrodes in a display circuit. Accordingly, a parasitic electric field may be generated in an unwanted position during the micro LED assembly process due to an electric field. Thus, it is important to minimize this phenomenon.

For this purpose, as shown in FIG. 3C, it is desirable to form an electrode that is formed on an entire area to serve as an electric field shielding layer so as to cover all elements of the circuit and at the same time to position the micro LEDs. When the first metal layer 130 is formed over the entire area, this may minimize the generation of the parasitic electric field and at the same time protect an underlying element from the electric field. FIG. 3C is a plan view of a patterned state of the first metal layer 130 after the first metal layer 130 is formed, and shows the first electrode layer 131 and the second electrode layer 133.

Figure 4A:
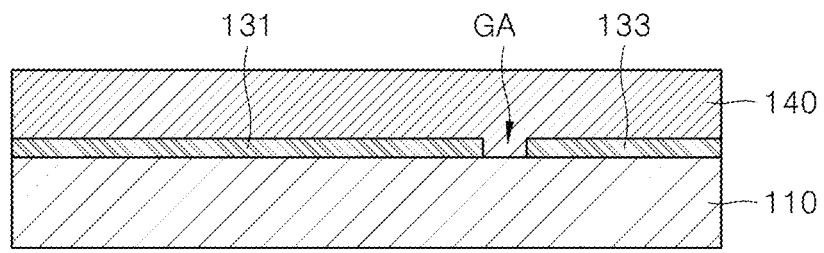
FIGS. 4A and 4B are cross-sectional views for illustrating an insulating layer forming step of forming an insulating layer containing a micro LED receiving area according to an embodiment of the present disclosure.
Figure 4B:
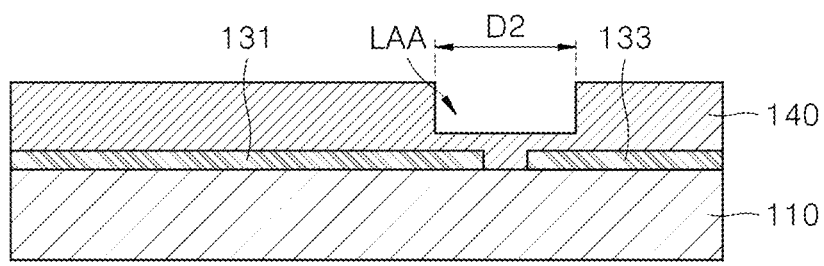

FIGS. 4A and 4B are cross-sectional views for illustrating an insulating layer forming step of forming an insulating layer containing a micro LED receiving area according to an embodiment of the present disclosure. FIG. 5 is a plan view for illustrating an insulating layer forming step of forming an insulating layer containing a micro LED receiving area according to an embodiment of the present disclosure.

Referring to FIGS. 4A and 4B and FIG. 5, an insulating layer 140 containing the micro LED receiving area LAA having the trench structure is formed during the insulating layer formation step after the electrode layer formation step.

As shown in FIG. 4A, an insulating layer 140 is deposited on the first electrode layer 131, the second electrode layer 133, and the gap area GA.

Then, as shown in FIG. 4B, a portion corresponding to the micro LED receiving area LAA of the insulating layer 140 is partially removed to form the micro LED receiving area LAA having the trench structure. In this connection, the partial removal means that an entirety of an insulating material in the micro LED receiving area LAA is not removed, but the insulating material therein partially remains by a predefined thickness.

In one example, a scheme of applying photoresist portions of different thicknesses on the insulating layer 140 and performing etching such that a portion of the insulating material in the micro LED receiving area LAA is etched in a larger amount than an amount in which a portion of the insulating material in an area other than the micro LED receiving area LAA is etched may be employed.

In another example, although not shown in the drawing, the insulating layer 140 may be deposited so as to have at least two separate layers and an upper layer of a portion corresponding to the micro LED receiving area LAA may be removed. Thus, the micro LED receiving area LAA may be formed.

As shown in FIG. 5, the micro LED receiving area LAA overlaps a portion of the gap area GA. The LED display 100 may have a plurality of micro LED receiving areas LAA arranged and spaced from each other by a predefined spacing along a length direction of the gap area GA.

A width D2 of the micro LED receiving area LAA is larger than a width D1 of the gap area GA.

Figure 6:
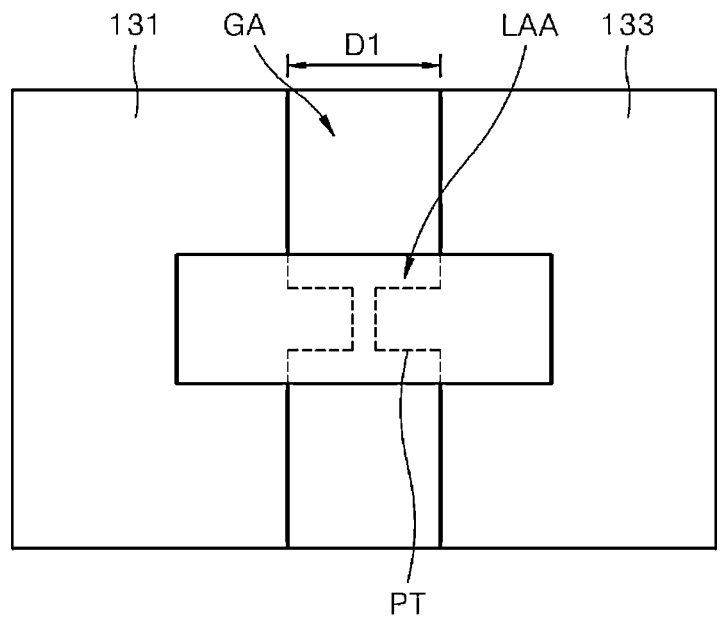
FIG. 6 is a plan view for illustrating an insulating layer forming step of forming an insulating layer containing a micro LED receiving area according to another embodiment of the present disclosure.

FIG. 6 is a plan view for illustrating an insulating layer forming step of forming the insulating layer containing the micro LED receiving area according to another embodiment of the present disclosure.

Referring to FIG. 6, in the micro LED receiving area LAA, the first electrode layer 131 and the second electrode layer 133 may be formed to protrude toward each other.

In other words, each of the first electrode layer 131 and the second electrode layer 133 may include a protrusion PT in the micro LED receiving area LAA.

Under the presence of the protrusion PT, an electric field may be concentrated on the micro LED receiving area LAA in a subsequent LED positioning step, thus improving the possibility of successful positioning of the micro LED ML.

In this case, the width D1 of the electrode gap is preferably controlled in a range in which the positioning of the micro LED is successful. It is preferable that the width D1 is smaller than a length of the micro LED.

Thus, it is preferable that the micro LED display according to the present disclosure includes the insulating layer 140 and the micro LED receiving area LAA. When there is no insulating layer 140, a short-circuit may occur when the nanowire-type micro LED is disposed between the first and second electrode layers 131 and 133. Accordingly, it is necessary to directly form the insulating layer 140 on the electrode layers 131 and 133. Alternatively, the insulating layer 140 should be formed over the entire area of the substrate, and a thin trench structure should be formed in the micro LED receiving area LAA.

In other words, even without the insulating layer 140 and the micro LED receiving area LAA, the micro LED may be positioned. However, in this case, as soon as the micro LED is positioned, a high current flows therein and the micro LED is destroyed.

When the micro LED receiving area LAA is formed, a relatively high electric field is generated in the micro LED receiving area LAA, such that electrophoresis works more selectively in the area LAA.

When a thickness of a portion of the insulating layer 140 between the trench structured micro LED receiving area LAA and each of the electrode layers 131 and 133 is too large, intensity of the electric field emitting from the electrode gap tends to decrease. Thus, it is desirable that the thickness of the portion of the insulating layer 140 between the trench structured micro LED receiving area LAA and each of the electrode layers 131 and 133 has an appropriate thickness. For example, the thickness of the portion of the insulating layer 140 between the trench structured micro LED receiving area LAA and each of the electrode layers 131 and 133 may be in a range of approximately 10 nm to 1 μm.

Figure 7:
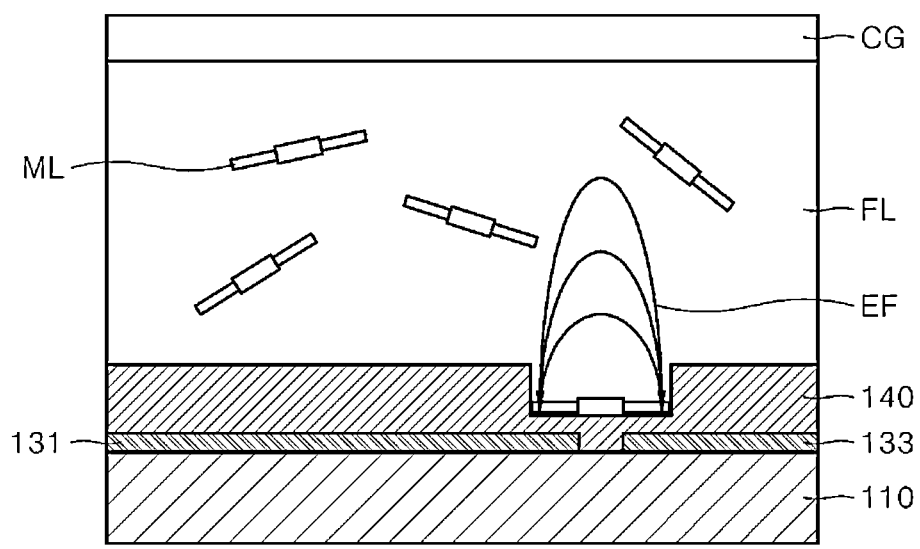
FIG. 7 is a cross-sectional view for illustrating an LED positioning step of positioning a LED according to an embodiment of the present disclosure.
Figure 8:
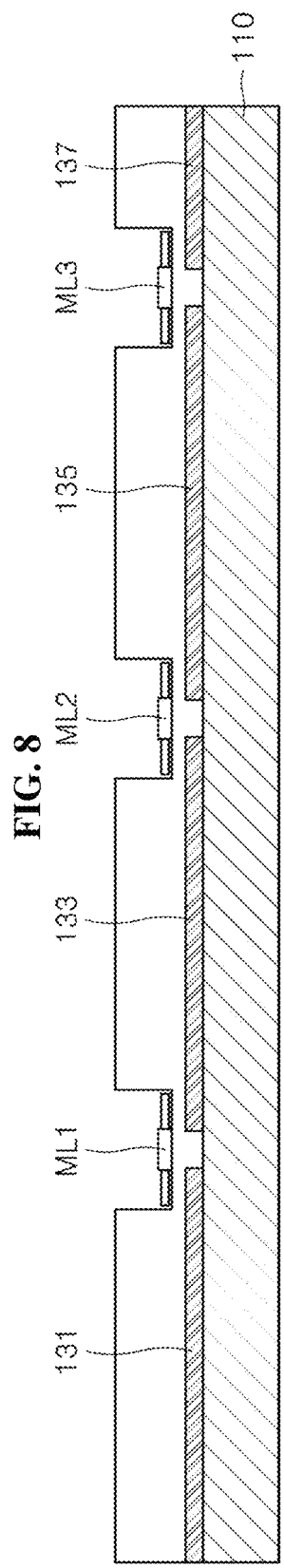
FIG. 8 is a cross-sectional view showing pixels in which LEDs are arranged according to an embodiment of the present disclosure.
Figure 9:
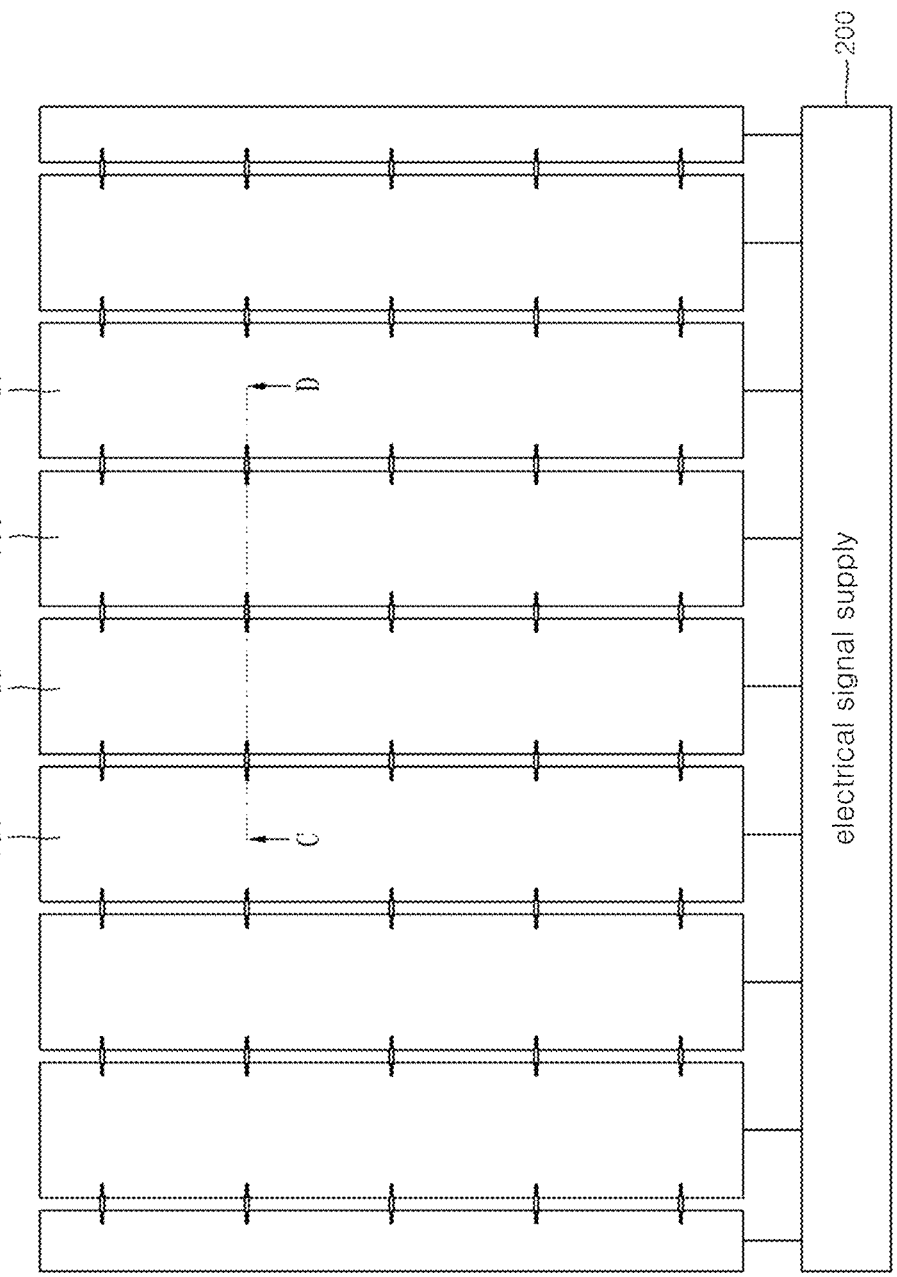
FIG. 9 is a plan view showing pixels in which LEDs are arranged according to an embodiment of the present disclosure.
Figure 10:
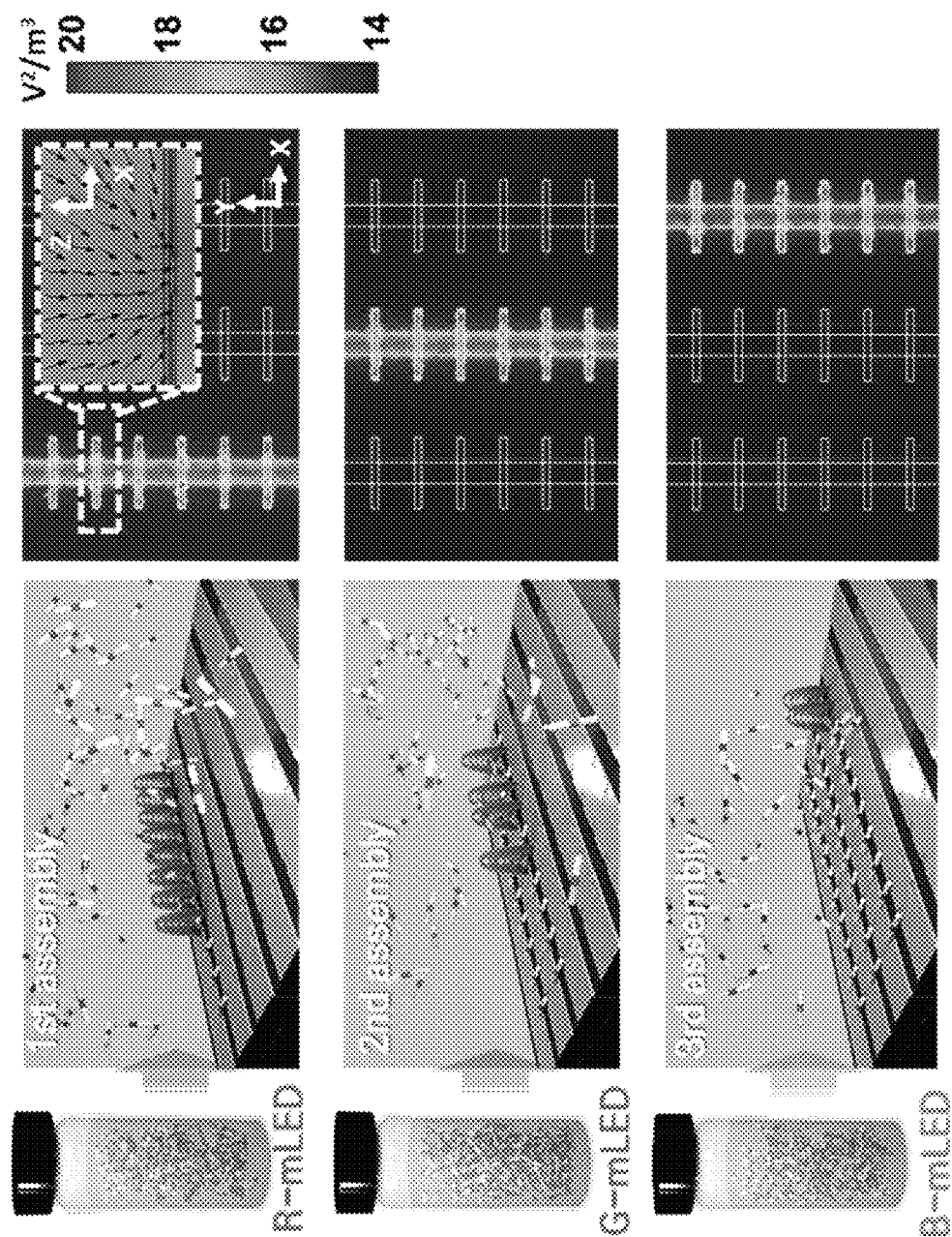
FIG. 10 shows a simulation result of an electric field generated between electrode layers.

FIG. 7 is a cross-sectional view for illustrating an LED positioning step of positioning a micro LED according to an embodiment of the present disclosure. FIG. 8 is a cross-sectional view showing pixels in which LEDs are arranged according to an embodiment of the present disclosure. FIG. 9 is a plan view showing pixels in which LEDs are arranged according to an embodiment of the present disclosure. FIG. 10 shows a simulation result of the electric field generated between the electrode layers.

Referring to FIG. 7 to FIG. 10, the micro LED ML is positioned in the micro LED receiving area LAA during the micro LED positioning step after the insulating layer formation step.

During the micro LED positioning step, fluid FL is supplied on the substrate 110. The fluid FL contains micro LEDs ML.

The fluid FL may be a liquid having a dielectric constant lower than that of the micro LED ML when an electrical signal is applied thereto from an electrical signal supply 200.

According to an embodiment, the fluid FL may be a liquid including at least one of isopropyl alcohol, acetone, toluene, and water.

While the fluid FL containing a plurality of micro LEDs ML is supplied on the substrate 110, the electrical signal supply 200 applies the electrical signal to the first electrode layer 131 and the second electrode layer 133, such that an electric field EF is generated between the first electrode layer 131 and the second electrode layer 133.

When the electric field EF is generated, one of the plurality of micro LEDs ML contained in the fluid FL may be positioned into the micro LED receiving area LAA via an attractive force of the electric field EF.

In this connection, the first electrode layer 131 and the second electrode layer 133 generate the electric field EF therebetween and at the same time, may serve as an electric field shielding layer for other circuits disposed below the first electrode layer 131 the second electrode layer 133.

The electrical signal supply 200 may supply a DC signal, an AC signal, or a pulsed DC signal to the first electrode layer 131 and the second electrode layer 133.

The electrical signal supply 200 may supply the pulsed DC signal to the first electrode layer 131 and the second electrode layer 133 so that orientations of the micro LEDs ML positioned in the micro LED receiving areas LAA are uniform.

In this connection, the pulsed DC signal means a periodic electrical signal whose a value changes but whose a polarity is kept to be constant.

For example, the electrical signal supply 200 may generate the pulsed DC signal by adding a bias DC signal to the AC signal.

FIG. 8 to FIG. 10 are diagrams for illustrating a method for transferring micro LEDs when types of micro LEDs ML are various.

For example, when there are three types of micro LEDs ML1, ML2, and ML3, the three types of micro LEDs ML1, ML2 and ML3 may be mounted into correct positions via there steps.

First, in order to mount the first micro LED ML1, the electrical signal supply 200 supplies the electrical signal to the first electrode layer 131 and the second electrode layer 133 while supplying the fluid FL containing the first micro LED ML1. An attractive force is generated between the first electrode layer 131 and the second electrode layer 133, so that the first micro LED ML1 may be mounted into a corresponding micro LED receiving area.

In this connection, the electrical signal supply 200 may not supply the electrical signal to a third electrode layer 135 and a fourth electrode layer 137, or may supply the electrical signal thereto such that an attractive force is not generated between the third electrode layer 135 and the fourth electrode layer 137 and the first electrode layer 131 or the second electrode layer 133.

Thereafter, in order to mount the second micro LED ML2, the electrical signal supply 200 supplies the electrical signal to the second electrode layer 133 and the third electrode layer 135 while supplying the fluid FL containing the second micro LED ML2. An attractive force is generated between the second electrode layer 133 and the third electrode layer 135, so that the second micro LED ML2 may be mounted into a corresponding micro LED receiving area.

Finally, in order to mount the third micro LED ML3, the electrical signal supply 200 supplies the electrical signal to the third electrode layer 135 and the fourth electrode layer 137 while supplying the fluid FL containing the third micro LED ML3. An attractive force is generated between the third electrode layer 135 and the fourth electrode layer 137 such that the third micro LED ML3 may be mounted into a corresponding micro LED receiving area.

It may be identified that a corresponding micro LED may be positioned into a corresponding micro LED receiving area via the electric field generated between the corresponding adjacent electrode layers sandwiching the corresponding micro LED receiving area therebetween in each assembly process as shown in FIG. 10.

FIG. 11 is a flowchart showing a method for positioning nano LEDs corresponding to RGB colors.

The electrical signal may be sequentially applied to each column of a plurality of columns, such that micro LEDs having different light emitting characteristics, for example, nano or micro LEDs corresponding to colors of R-G-B may be arranged as display pixels on a display backplane. In this connection, in order to sequentially generate the electric field, a circuit device that may apply the electric signals individually may be employed.

In order to separately apply an electric field to each pixel to realize RGB full colors, the micro LEDs may be arranged in a following manner regardless of an order.

While supplying the fluid containing a red LED among a plurality of LEDs, the electrical signal is applied to the first electrode layer and the second electrode layer connected to the red pixel, such that the red LED is positioned into a red micro LED receiving area. Then, the substrate (backplane) may be dried.

Further, while supplying the fluid including a green LED among the plurality of LEDs, the electrical signal is applied to the first electrode layer and the second electrode layer connected to a green pixel, such that the green LED is positioned into a green micro LED receiving area. Then, the substrate (backplane) may be dried.

Further, while supplying the fluid including a blue LED among the plurality of LEDs, the electrical signal is applied to the first electrode layer and the second electrode layer connected to a blue pixel, such that the blue LED is positioned into a blue micro LED receiving area. Then, the substrate (backplane) may be dried.

In this way, the fluid supply, the micro LED positioning, and the drying processes may be repeated. Thus, the R-G-B nano LED array may be formed on the display substrate. Then, a full-color display element may be completed using electrode formation and metal electrode patterning processes.

FIGS. 12A to 12D are cross-sectional views for illustrating an LED electrically-connecting step of electrically-connecting an LED according to an embodiment of the present disclosure and an electrode forming step of forming a first electrode, a second electrode and a power electrode. FIG. 13 is a cross-sectional view showing an LED assembly step, an electrode formation step, and an electrode patterning and element separation step according to an embodiment of the present disclosure.

Referring to FIGS. 12A to 12D and FIG. 13, the insulating layer 140 is removed during the micro LED electrically-connecting step after the micro LED positioning step. Then, both opposing horizontal ends of the micro LED ML may be electrically coupled to the first electrode layer 131 and the second electrode layer 133, respectively.

Figure 12A:
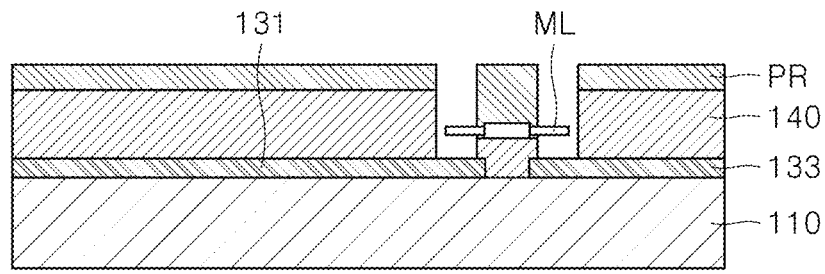
FIGS. 12A to 12D are cross-sectional views for illustrating an LED electrically-connecting step of electrically-connecting an LED according to an embodiment of the present disclosure and an electrode forming step of forming a first electrode and a second electrode.
Figure 13:
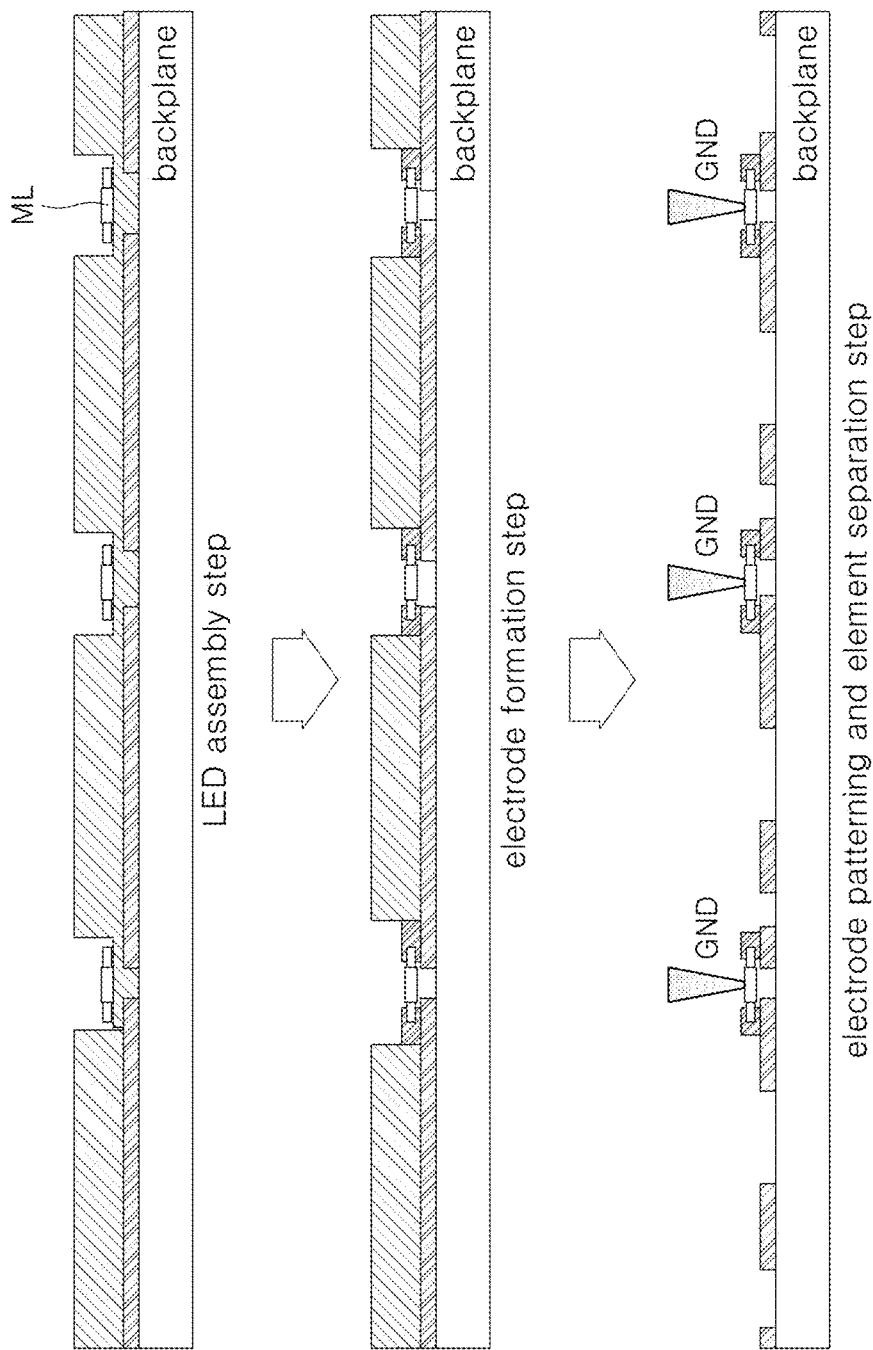
FIG. 13 is a cross-sectional view showing an LED assembly step, an electrode formation step, an electrode patterning step, and an element separation step according to an embodiment of the present disclosure.

As shown in FIG. 12A, photoresist PR is applied on the insulating layer 140 on which the micro LEDs ML are arranged. A photoresist pattern is formed by removing a portion of the applied photoresist PR corresponding to each of the both opposing horizontal ends of the micro LED ML. Then, the method performs etching using the formed photoresist pattern as an etching mask, such that a portion of the insulating layer 140 below each of both opposing horizontal ends of the micro LED ML may be removed.

Figure 12B:
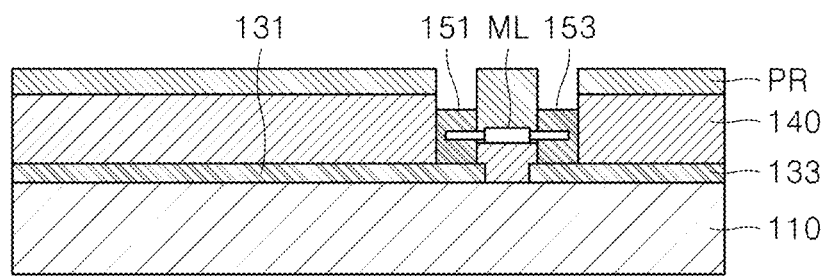

Thereafter, as shown in FIG. 12B, a first fixing electrode 151 and a second fixing electrode 153 may be formed in each of the portions in which the insulating layer 140 has been removed by depositing or electroplating a metal into each of the portions in which the insulating layer 140 is removed. An example of the deposition may include electrodeposition, for example, electrophoretic deposition.

One horizontal end of the micro LED ML may be electrically connected to the first electrode layer 131 via the first fixing electrode 151 and may be physically fixed thereto. Similarly, the other horizontal end of the micro LED ML may be electrically connected to the second electrode layer 133 via the second fixing electrode 153, and may be physically fixed thereto. A vertical dimension of each of the first fixing electrode 151 and the second fixing electrode 153 may be adjusted based on a distance between each of the first fixing electrode 151 and the second fixing electrode 153 and each of the electrodes 131 and 133 in the micro LED receiving area LAA. As shown in FIG. 11, the vertical dimension may have a predefined value, or each of the first fixing electrode 151 and the second fixing electrode 153 may be present in a form of a thin film as shown in FIGS. 12A to 12D.

Figure 12C:
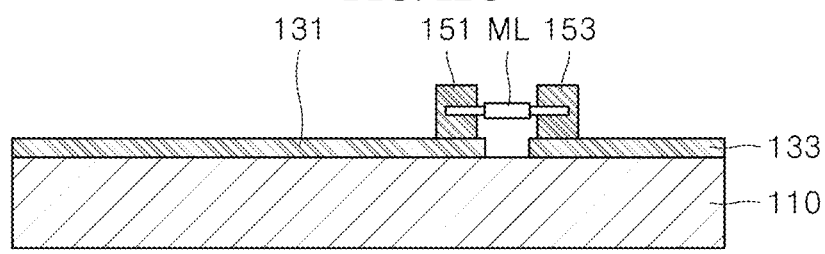

Then, as shown in FIG. 12C, the photoresist PR and the insulating layer 140 are completely removed.

During the electrode forming step after the micro LED electrically-connecting step, a first electrode 161, a second electrode 163, and a power electrode 165 are formed.

Figure 12D:
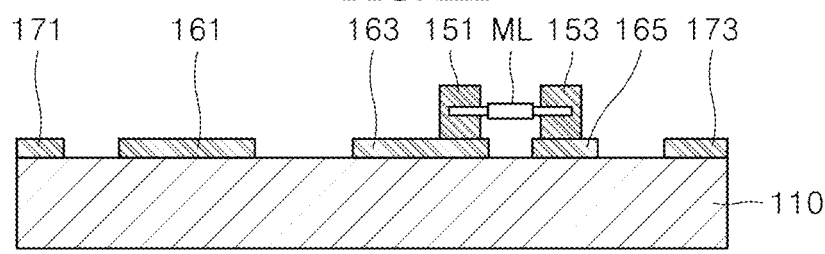

As shown in FIG. 12D, predefined areas may be removed. That is, a middle area may be removed from the first electrode layer 131, and a middle area may be removed from the second electrode layer 133. Thus, the first electrode 161, the second electrode 163, and the power electrode 165 may be formed.

As the electrodes are separated from each other by etching, metal layers 171 and 173 remain on a left side of the first electrode 161 and on a right side of the power electrode 165, respectively. When a complex circuit such as 2 transistors and 1 capacitor is required in the micro LED display, the metal layers 171 and 173 may be used as adjacent electrodes.

Thereafter, although not shown in the drawings, if necessary, a material capable of protecting the completed circuit, that is, the first electrode 161, the second electrode 163, the power electrode 165, the fixing electrodes 151 and 153 and the micro LED ML may be coated thereon over an entirety thereof, thereby completing the micro LED display 100.

Thus, the method for transferring the micro LED according to the present disclosure may supply the fluid containing the plurality of micro LEDs, and position the micro LEDs ML into the corresponding micro LED receiving areas using the electric field generated between the corresponding electrode layers, such that a corresponding micro LED may be easily mounted into a desired position on the substrate. In addition, the method for transferring the micro LED according to the present disclosure may manufacture the micro LED display in a cheaper and fast manner and at a higher yield.

The micro LED display manufactured using the method for transferring the micro LED according to the present disclosure may include the first electrode layer 131 and the second electrode layer 133 on the substrate, the micro LED having both opposing horizontal ends coupled to the first electrode layer 131 and the second electrode layer 133, respectively, and the fixing electrodes including the first fixing electrode 151 and the second fixing electrode 153.

Specifically, the second electrode layer 133 is disposed on the substrate while being horizontally spaced apart from the first electrode layer 131.

The first fixing electrode 151 extends upwardly from the first electrode layer 131. The second fixing electrode 153 extends upwardly from the second electrode layer 133. Accordingly, both opposing horizontal ends of the micro LED are respectively coupled to the first fixing electrode 151 and the second fixing electrode 153.

The first fixing electrode 151 and the second fixing electrode 153 are arranged to be spaced apart from each other. The micro LED may be spaced from atop face of the first electrode layer 131 and a top face of the second electrode layer 133, and thus may be spaced apart from a substrate surface, so that a heat dissipation effect may be realized.

Detailed descriptions of the gap area, the micro LED receiving area, etc. are the same as described above with referring to the method for transferring the micro LED, and thus will be omitted.

As described above, the present disclosure has been described with reference to the illustrated drawings. However, the present disclosure is not limited to the embodiments and drawings disclosed herein. It is obvious that various modifications may be made by those skilled in the art within the scope of the technical idea of the present disclosure. In addition, when the descriptions of the embodiment of the present disclosure are set forth, some effects according to the configurations of the present disclosure are not explicitly described. However, it is natural that the predictable effects from the configurations should be further appreciated.

What is claimed is:

1. A method for transferring a micro LED, the method comprising:
   an electrode layer forming step of forming a first electrode layer and a second electrode layer on a substrate such that the first and second electrode layers are horizontally spaced from each other;
   an insulating layer forming step of forming an insulating layer so as to cover an entirety of the first electrode layer, the second electrode layer and a gap area between the first electrode layer and the second electrode layer and such that a micro LED receiving area having a trench structure is formed in the insulating layer to overlap with a partial area of the gap area;
   an LED positioning step of applying an electrical signal to the first electrode layer and the second electrode layer while supplying fluid containing there in the micro LED on the substrate, such that the micro LED is positioned into the micro LED receiving area having the trench structure; and
   an LED electrically-connecting step of partially removing the insulating layer and electrically-connecting both opposing horizontal ends of the micro LED to the first electrode layer and the second electrode layer, respectively,
   wherein a long side length of the micro LED receiving area having the trench structure is larger than a width of the gap area, and
   wherein the first electrode layer and the second electrode layer are formed to protrude towards each other and to overlap with the micro LED receiving area having the trench structure.

2. The method of claim 1, wherein the electrode layer forming step includes:
   forming a first metal layer on the substrate; and
   removing a portion of the first metal layer corresponding to the gap area to form the first electrode layer and the second electrode layer spaced from each other.

3. The method of claim 1, wherein the insulating layer forming step includes:
   forming the insulating layer on the first electrode layer, the second electrode layer, and the gap area; and
   partially etching a portion of the insulating layer corresponding to the partial area of the gap area to form the micro LED receiving area.

4. The method of claim 1, wherein the electrical signal is a pulsed DC signal.

5. The method of claim 1, wherein the fluid includes at least one of isopropyl alcohol, acetone, toluene or water.

6. A method for transferring a micro LED, the method comprising:
   an electrode layer forming step of forming a first electrode layer and a second electrode layer on a substrate such that the first and second electrode layers are horizontally spaced from each other;
   an insulating layer forming step of forming an insulating layer so as to cover an entirety of the first electrode layer, the second electrode layer and a gap area between the first electrode layer and the second electrode layer and such that a micro LED receiving area having a trench structure is formed in the insulating layer to overlap with a partial area of the gap area;
   an LED positioning step of applying an electrical signal to the first electrode layer and the second electrode layer while supplying fluid containing there in the micro LED on the substrate, such that the micro LED is positioned into the micro LED receiving area having the trench structure; and
   an LED electrically-connecting step of partially removing the insulating layer and electrically-connecting both opposing horizontal ends of the micro LED to the first electrode layer and the second electrode layer, respectively,
   wherein the LED electrically-connecting step includes:
   applying photoresist on the insulating layer and the micro LED;
   removing portions of the photoresist corresponding to both opposing horizontal ends of the micro LED to form a photoresist pattern;
   removing portions of the insulating layer respectively disposed below the both opposing horizontal ends of the micro LED using the photoresist pattern as an etching mask;
   depositing or electroplating a metal into the portions in which the insulating layer has been removed such that the both opposing horizontal ends of the micro LED are electrically connected to the first electrode layer and the second electrode layer via the metal, respectively; and
   removing an entirety of the photoresist and the insulating layer.

7. A method for transferring a micro LED, the method comprising:
   an electrode layer forming step of forming a first electrode layer and a second electrode layer on a substrate such that the first and second electrode layers are horizontally spaced from each other;

an insulating layer forming step of forming an insulating layer so as to cover an entirety of the first electrode layer, the second electrode layer and a gap area between the first electrode layer and the second electrode layer and such that a micro LED receiving area having a trench structure is formed in the insulating layer to overlap with a partial area of the gap area;

an LED positioning step of applying an electrical signal to the first electrode layer and the second electrode layer while supplying fluid containing there in the micro LED on the substrate, such that the micro LED is positioned into the micro LED receiving area having the trench structure; and an LED electrically-connecting step of partially removing the insulating layer and electrically-connecting both opposing horizontal ends of the micro LED to the first electrode layer and the second electrode layer, respectively, wherein the method further comprises an electrode forming step of etching each of the first electrode layer and the second electrode layer into a predefined pattern to form a first electrode, a second electrode, and a power electrode.

* * * * *